(12) United States Patent
Tsai et al.

(10) Patent No.: US 6,176,417 B1
(45) Date of Patent: Jan. 23, 2001

(54) BALL BONDING METHOD ON A CHIP

(75) Inventors: Yu-Fang Tsai; Su Tao, both of Kaohsiung; Simon Lee, Tainan; Tao Yu Chen, Kaohsiung, all of (TW)

(73) Assignee: Advanced Semiconductor Engineering Inc., Kaohsiung (TW)

( * ) Notice: Under 35 U.S.C. 154(b), the term of this patent shall be extended for 0 days.

(21) Appl. No.: 09/419,288

(22) Filed: Oct. 15, 1999

(51) Int. Cl.$^7$ .......................... B23K 31/00; B23K 31/02; H01L 21/44; H01L 21/48; H01L 21/50
(52) U.S. Cl. .................. 228/180.5; 228/180.22; 438/613; 438/51; 438/55; 438/64; 438/108; 438/123; 29/829
(58) Field of Search ............ 228/180.5, 180.22, 228/4.5; 29/592.1; 438/51, 55, 64, 108, 111, 120, 123

(56) References Cited

U.S. PATENT DOCUMENTS

| | | |
|---|---|---|
| 5,328,079 | 7/1994 | Mathew et al. . |
| 5,616,520 * | 4/1997 | Nishiuma et al. .................. 438/125 |
| 5,633,204 * | 5/1997 | Tago et al. ............................ 428/614 |
| 5,821,494 * | 10/1998 | Albrecht et al. ................. 219/121.64 |
| 5,871,141 * | 2/1999 | Hadar et al. ....................... 228/180.5 |
| 5,957,371 * | 9/1999 | Miyano et al. .................... 228/180.5 |
| 6,020,220 * | 2/2000 | Gilleo et al. ........................... 438/119 |

* cited by examiner

Primary Examiner—Patrick Ryan
Assistant Examiner—Colleen P. Cook
(74) Attorney, Agent, or Firm—Bacon & Thomas

(57) ABSTRACT

A ball bonding method on a chip mainly comprises steps of: a wire is burned to form a ball on a capillary; the capillary is moved down to a second bonding point for ball bonding; and the capillary is moved up in a vertical direction thereby pulling the tip of the ball to be cut such that the ball has a uniformly body shape and tip height. Therefore, the ball provides uniform body shape and tip height for wire bonding at a second bonding point under lower variability conditions thus increasing the reliability of products.

8 Claims, 11 Drawing Sheets

BALL BONDING METHOD ON A CHIP

BACKGROUND OF THE INVENTION

1. Field of the Invention

The present invention relates generally to a ball bonding method on a chip and more particularly to the configuration of the ball or bump on the second bonding pad such that all of the balls or bumps have a uniform shape and size of vertical tips.

2. Description of the Related Art

For many years wire bonding prevented damage to the bonding pad from the capillary hitting the bonding pad directly by forming a ball on the bonding pad prior to wire bonding so that the capillary would hit the ball during wire bonding. The ball-forming process comprises the following steps: ball formation on a capillary; thermocompression bonding on a bonding pad; capillary horizontal movement for stitch bonding; and capillary vertical movement for wire cutting.

U.S. Pat. No. 5,641,079, issued on Jul. 12, 1994 to Mathew et al., discloses method for bond wire connection and a conductive bump thereof prior to stitch bonding. As shown in FIG. 1, U.S. Pat. No. 5,641,079, a substrate 100 is attached to a chip 110 which has a second bond point as well as a bonding pad 111. A capillary 120 of the thermosonic or thermocompression ball bonding tool forms a bump on each bonding pad 111 and connections are made to the bonding pads 111 of the chip 110 by means of stitching bonding in a way which does not damage the chip 110. A bump 121 is formed at the free end of the wire in the capillary 120. Then, the clamp 130 is closed to hold the wire.

As shown in FIG. 2, the capillary 120 is moved down in a vertical direction to the second bonding point so as to let the bottom of the bump 121 weld to the bonding pad 111. Then, the capillary 120 does not hit the bonding pad 111 and the clamp 130 of the capillary 120 is opened to release the wire.

As shown in FIG. 3, the capillary 120 is moved in a horizontal direction thereby moving the tip as well as connection part 122 to the side. Then the capillary 120 is moved down again in a vertical direction so as to press the tip 122 of the bump 121 to form a thin neck. Then, the capillary 120 is opened to hold the wire.

As shown in FIGS. 4 and 5, the capillary 120 is moved up in a vertical direction and then the clamp 130 is closed thereby cutting the thin neck portion which connects to the tip 122 of the bump 121 such that the bump 121 is left on the bonding pad 111. Because the bump 121 on the bonding pad 111 is pressed by the capillary 120, the tip 122 of the bump 121 is formed in a particular direction and collapse shape. The direction and collapse shape of the tip 122 determines the parameter (e.g., the movement) of the wire bonding tool for the second bonding so as to increase quality and reliability of products. However, the direction and collapse shape of the tip 122 of each bump 121 are various and parameter adjustment of each wire bonding is impossible in this circumstance. Thus only one set of parameters can be used in each wire bond, and we are unable to control the quality and reliability of wire bonding of products under these parameter controls.

The present invention intends to provide a ball with a uniform shape and height for wire bonding at a second bonding point to decrease the variability of the ball and increase work window range in such a way as to mitigate and overcome the above problem.

SUMMARY OF THE INVENTION

The primary objective of this invention is to provide a ball bonding method on the chip where a ball is bonded at a second bonding point and then pulled to form a uniform body and tip which provide for uniform wire bonding thereby decreasing the variability of wire bonding and increasing the reliability of products.

The present invention is a ball bonding method in accordance with an embodiment comprising steps of: a wire is burned to form a ball on a capillary; the capillary is moved down to a second bonding point for ball bonding; and the capillary is moved up in a vertical direction thereby pulling the tip of the ball to be cut such that the ball has an uniformly shape body and tip. Therefore, the ball provides uniform body shape and tip height for wire bonding at a second bonding point under lower variability conditions.

When wire bonding on a ball at a second bonding point, the present invention allows a larger wire bonding area and products thereof have the same quality and reliability.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

The present invention is a ball bonding method on a chip mainly comprising steps of: a wire is burned to form a ball on a capillary; the capillary is moved down to a second bonding point for ball bonding; and the capillary is moved up in a vertical direction thereby pulling the tip of the ball to be cut such that the ball has an uniformly shaped of body and tip height. Therefore, the ball provides uniform body shape and tip height for wire bonding at a second bonding point under lower variability conditions to increase the reliability of products.

Figure 6:
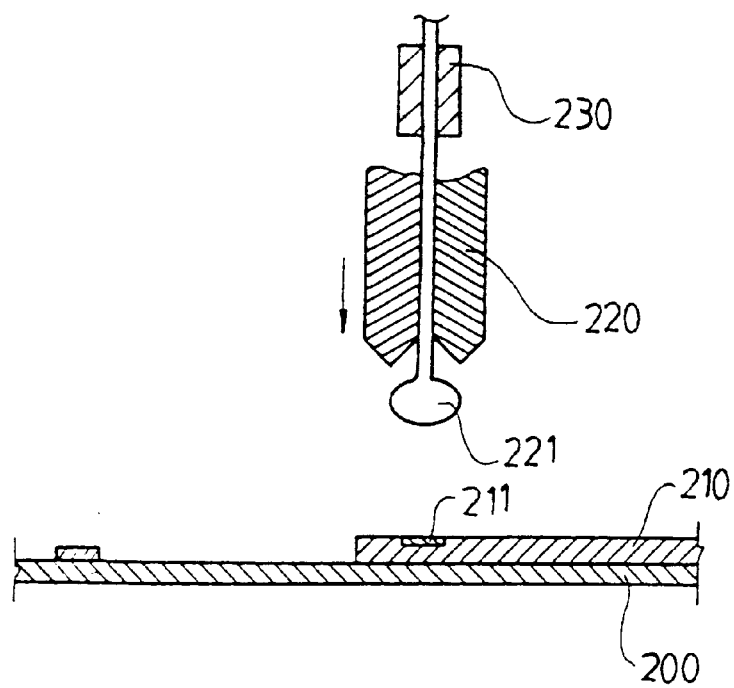
FIG. 6 is a schematic view of a wire bonding first step in accordance with the present invention.

Referring to FIG. 6, a substrate 200 is attached by a chip 210 on which is formed a second bonding point. The second bonding point is a bonding pad 211 which provides for a capillary 220 ball bonding in the second wire bonding thereby allowing the chip 210 to avoid damage from being hit by the capillary 220. A ball 221 on the free end of the wire is burnt to form an opening of the capillary 220 in the first step.

Figure 7:
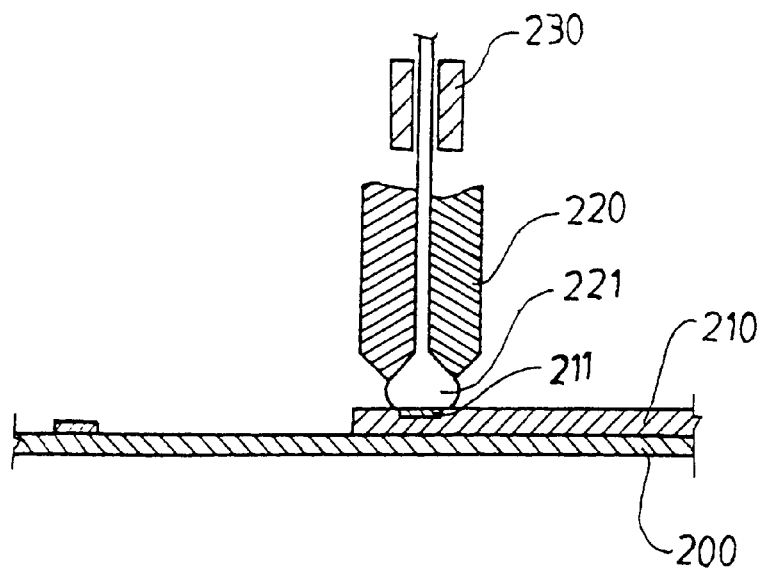
FIG. 7 is a schematic view of a wire bonding second step in accordance with the present invention.

Referring to FIG. 7, the capillary 220 is moved down in a vertical direction to the bonding pad 211 (second bonding point) so as to let the bottom of the ball 221 weld to the bonding pad 211. So, the capillary 220 does not hit the bonding pad 211. The clamp 230 of the capillary 220 is opened to release the wire.

Figure 8:
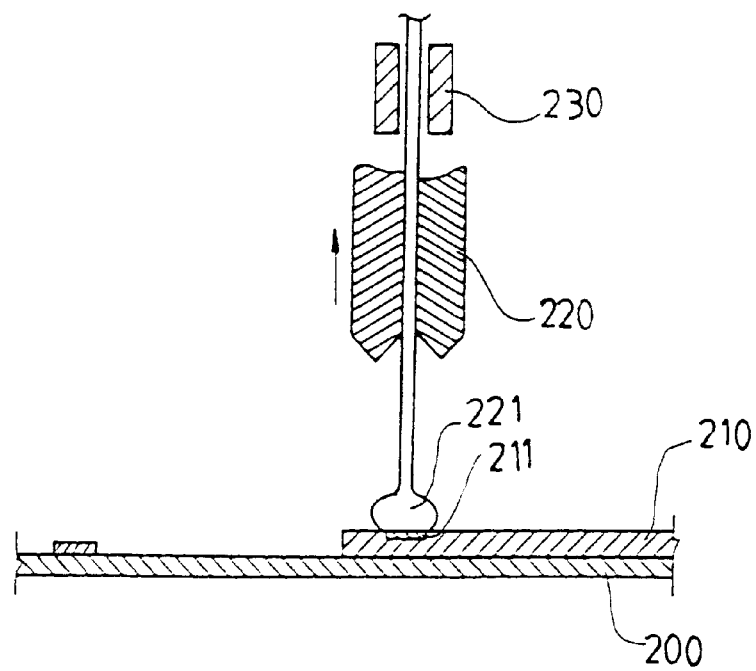
FIG. 8 is a schematic view of a wire bonding third step in accordance with the present invention.

Referring to FIG. 8, the capillary 220 is moved up in a vertical direction from the bonding pad 211, and then the wire is extended a predetermined distance and the clamp 230 is opened to release the wire so a tip 222 of the ball 221 connects to the wire through the extension.

Figure 9:
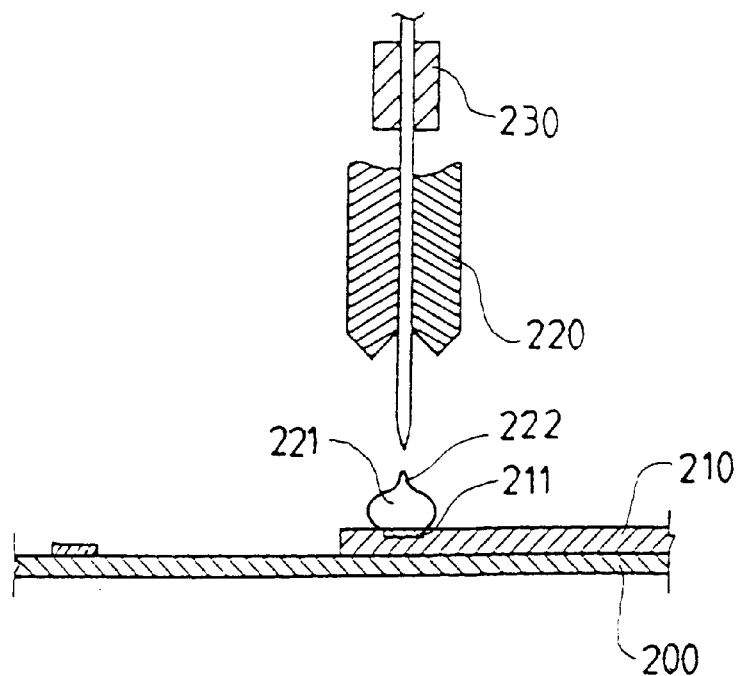
FIG. 9 is a schematic view of a wire bonding fourth step in accordance with the present invention.
Figure 10:
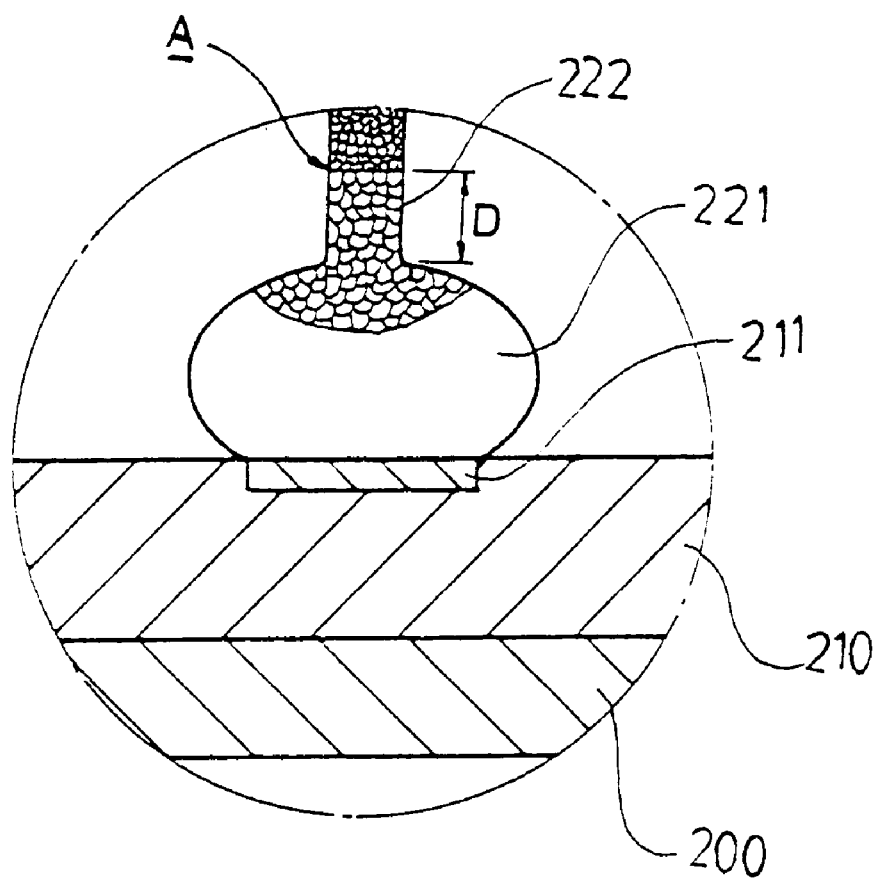
FIG. 10 is an enlarged view of FIG. 9 in accordance with the present invention.

Referring to FIGS. 9 and 10, the clamp 230 is closed to hold the wire and then is moved up again in a vertical direction from the bonding pad 211 such that the wire is cut along the surface A by the force of tension. The balls 221 are similar to one another and the tips 222 thereof have a column-like shape and approximately similar height. The column-like tips 222 have a heat reflow affected portion which determines the height of the tips 222 as defined by the surface A. Despite the height of the tips 222 having little difference, the tips 222 mainly provide a uniform shape for wire bonding. However, the ball 221 provides a uniform shape for the body and height of the tip 222 for wire bonding at a second bonding point under lower variability conditions to increase the reliability of products. Because the second wire bonding of the present invention allows a larger wire bonding area, the capillary 220 and the wire together press the tip 222 to within a larger deviation (from −0.2 mil to 1.0 mil) and deformation occurs under the qualification and reliability, as shown in FIGS. 13 through 19. The first wire bonding point is deposed on a chip or a substrate or a lead frame. The second wire bonding point is deposed on a chip and a plurality of wires connects the first wire bonding point to the second wire bonding point to form a closed loop.

Figure 1:
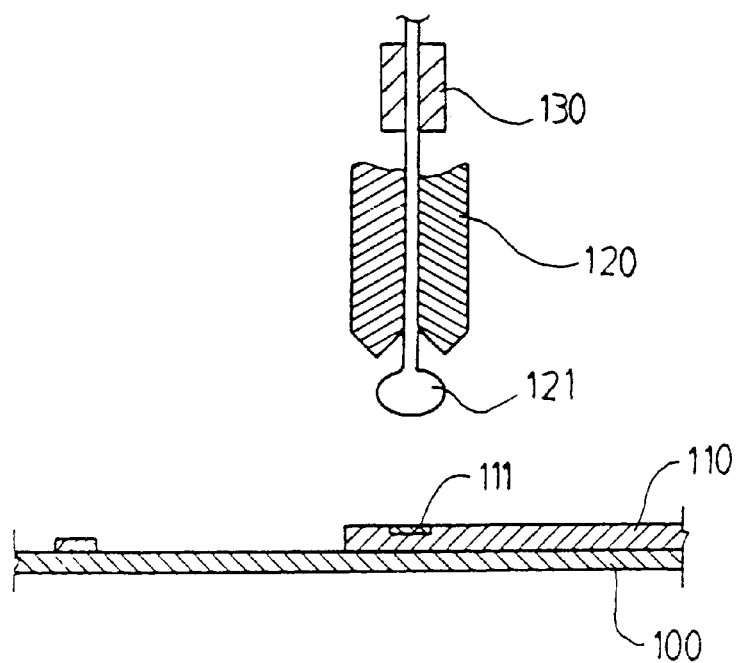
FIG. 1 is a schematic view of a wire bonding first step in accordance with U.S. Pat. No. 5,641,079.
Figure 2:
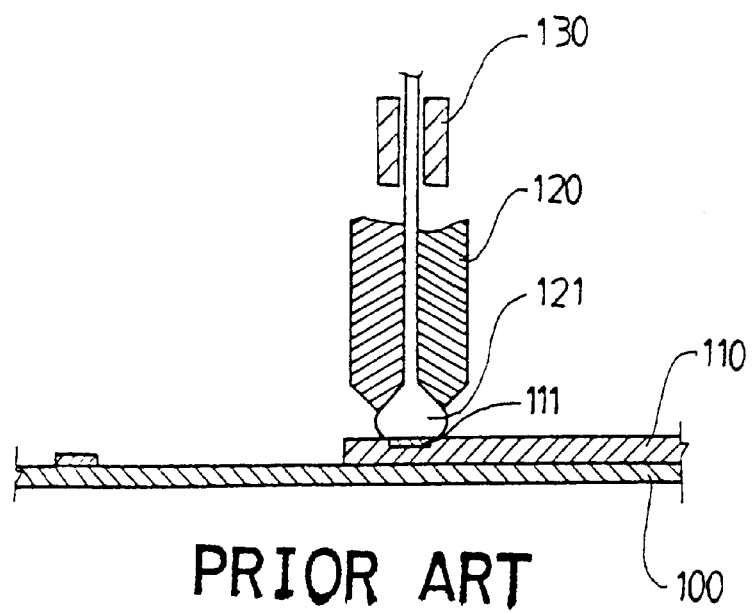
FIG. 2 is a schematic view of a wire bonding second step in accordance with U.S. Pat. No. 5,641,079.
Figure 3:
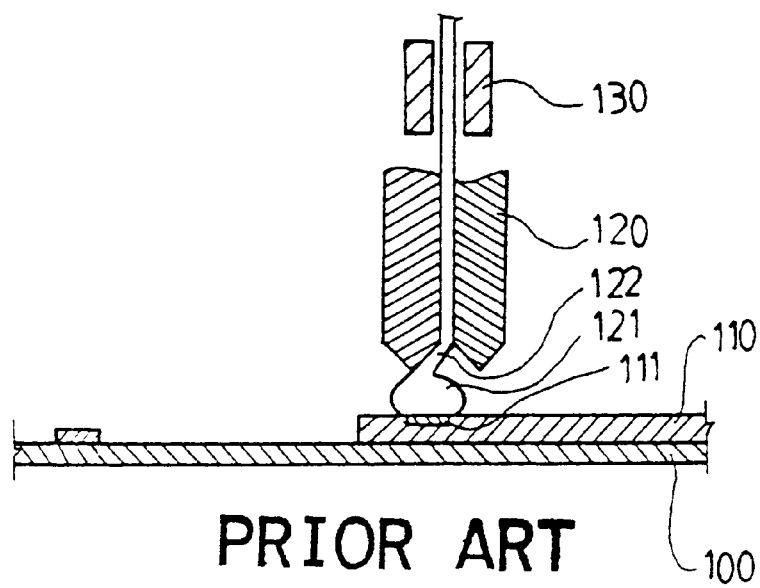
FIG. 3 is a schematic view of a wire bonding third step in accordance with U.S. Pat. No. 5,641,079.
Figure 4:
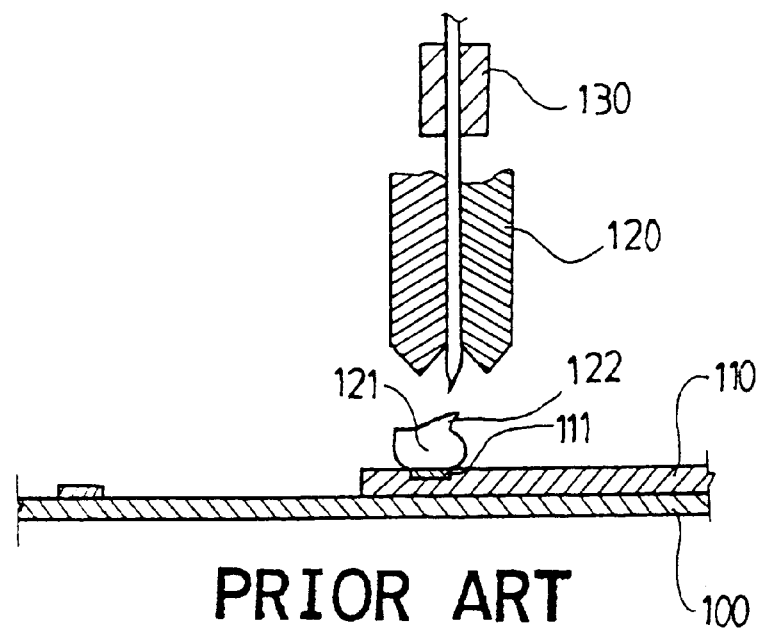
FIG. 4 is a schematic view of a wire bonding fourth step in accordance with U.S. Pat. No. 5,641,079.
Figure 5:
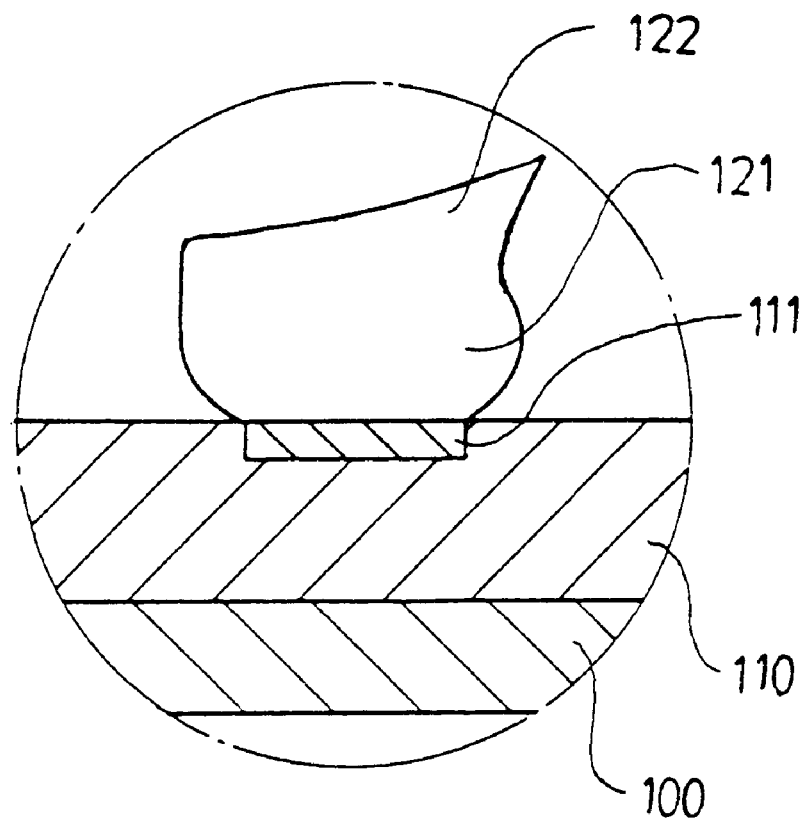
FIG. 5 is an enlarged view of FIG. 4 in accordance with the present invention.

Comparing FIG. 3 with FIG. 9, the capillary 120 of No. 5,641,079 is moved in a horizontal direction; therefore the tip 122 lies to the side, and the capillary 120 is moved down again in a vertical direction so as to press the tip 122 of the bump 121 to form a thin neck and collapsed body. Thus, the bump 121 has various configurations and shapes of body and tip that increase the variability of wire bonding. Increasing the variability affects the strength of the wire bonding thereby reducing resistance to the wire sweep during encapsulant molding. The use of fine pitch for IC increases the opportunity of wire short and decreases the reliability of products. The capillary 220 is moved up in a vertical direction from the bonding pad 211 such that the wire is cut by tension force along the surface A which determines the heat-affected zone and the height of the tip 222. The heat-affected zone is the reformation of the metal between the ball 221 and the wire during wire burning. The surface A between two different materials is fragile during the pulling the capillary 220 in a vertical direction to form the approximate height of tip 222. Without pressing process on the ball 221, the present invention provides uniform shape of body and height of the ball 221 for a second wire bonding thus decreasing the variability of wire bonding and increasing the reliability of products. In addition, the process time is reduced so the formation of the ball 221 is simpler than by conventional methods.

The present invention uses the bonder K&S1488 and the capillary Micro-swiss414A with opening size 15. The ratio of the wire diameter to ball diameter is 1.0:2.2. Referring to FIG. 10, the use of MGMF wire material (Mitsubishi product) in the present invention makes the length of heat-affected zone (H. A. Z.) from 94 to 96 mm, and using the MGM7 wire material (Mitsubishi product) makes the length of heat-affected zone from 102 to 105 mm. Therefore, the condition of the wire material and the approximate height D provides stability in the second wire bonding.

Figure 11:
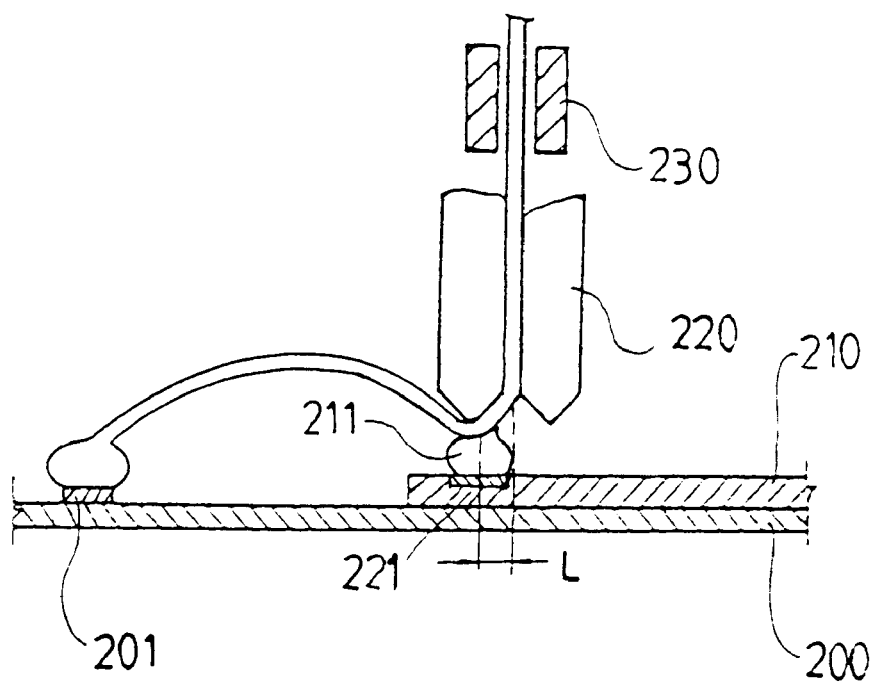
FIG. 11 is a schematic view of a second wire bonding in accordance with the present invention.

Referring to FIG. 11, a substrate 200 of the present invention has a wire connecting to the bonding pad of the first bonding point, the capillary 220 is moved to the second bonding point and then bonds on a ball 221 of the chip 210. The route of the capillary 220 to the second bonding point has a larger deviation L (from −0.2 mil to 1.0 mil) because the ball 221 has uniform shape and height. Thus the present invention can provide a larger wire bonding area on the second bonding point in the wire bonding process, as shown in FIGS. 13 through 19, so as to increase the reliability of product.

Figure 12:
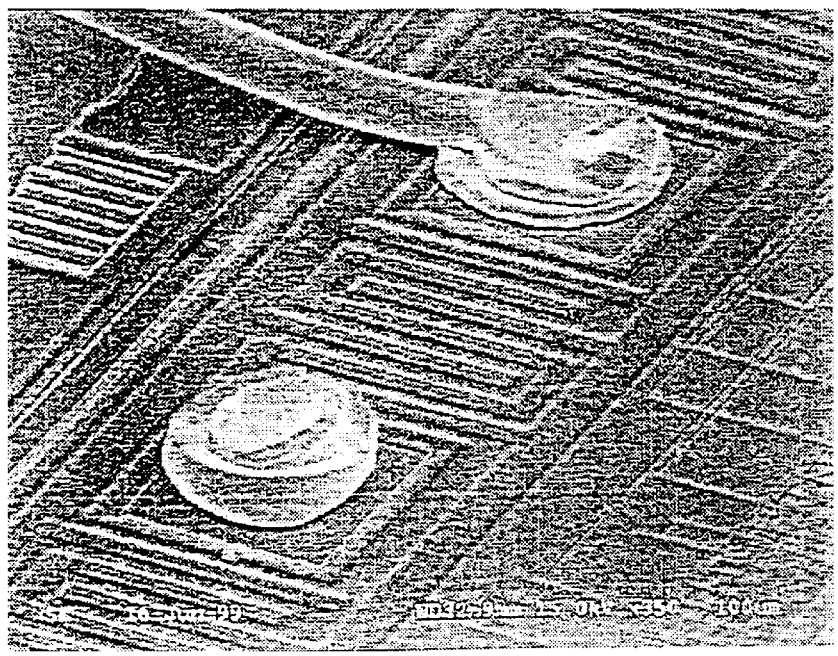
FIG. 12 is a perspective view of a wire bonding connection in accordance with the conventional method.
Figure 13:
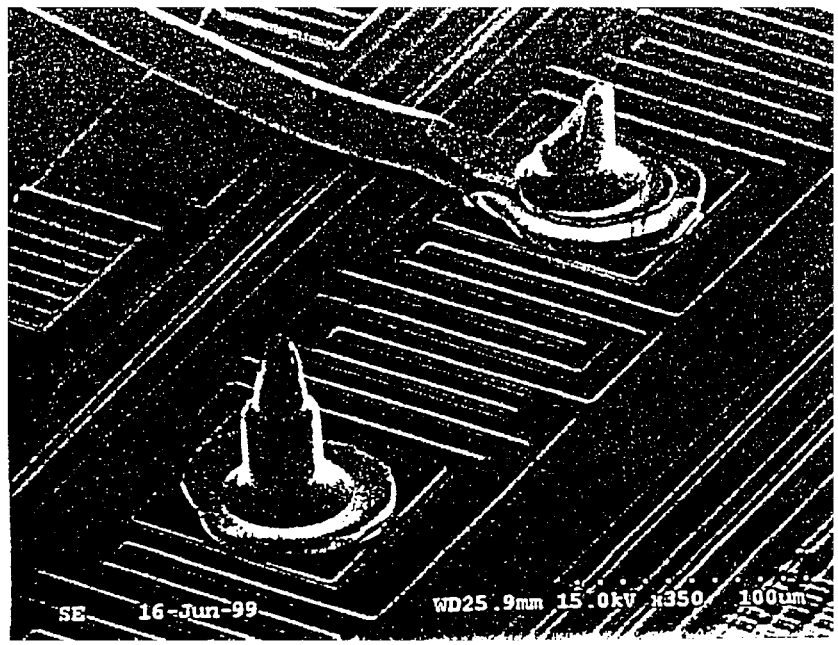
FIG. 13 is a perspective view of a wire bonding connection with −0.2 mil deviation of the second wire bonding in accordance with the present invention.
Figure 14:
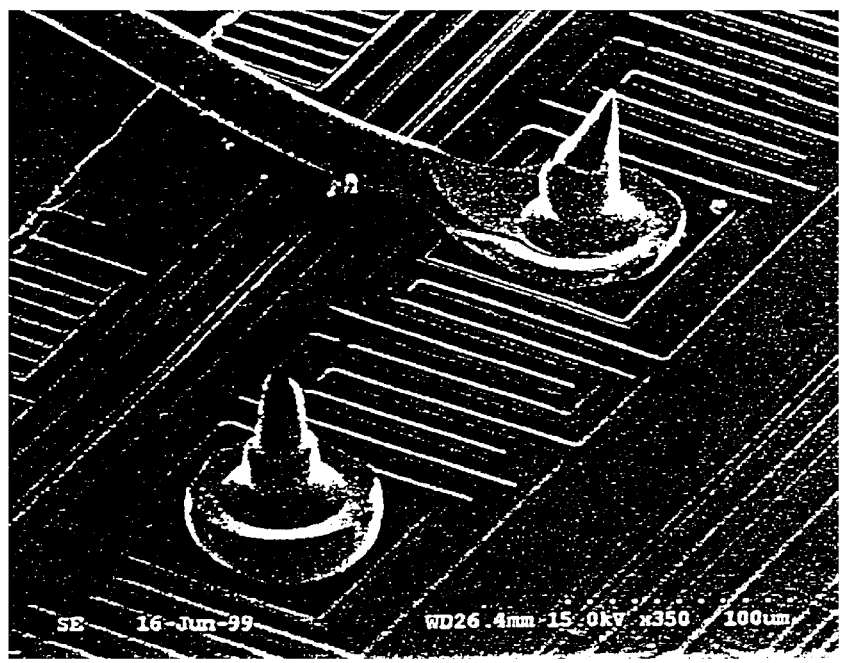
FIG. 14 is a perspective view of a wire bonding connection without deviation of the second wire bonding in accordance with the present invention.
Figure 15:
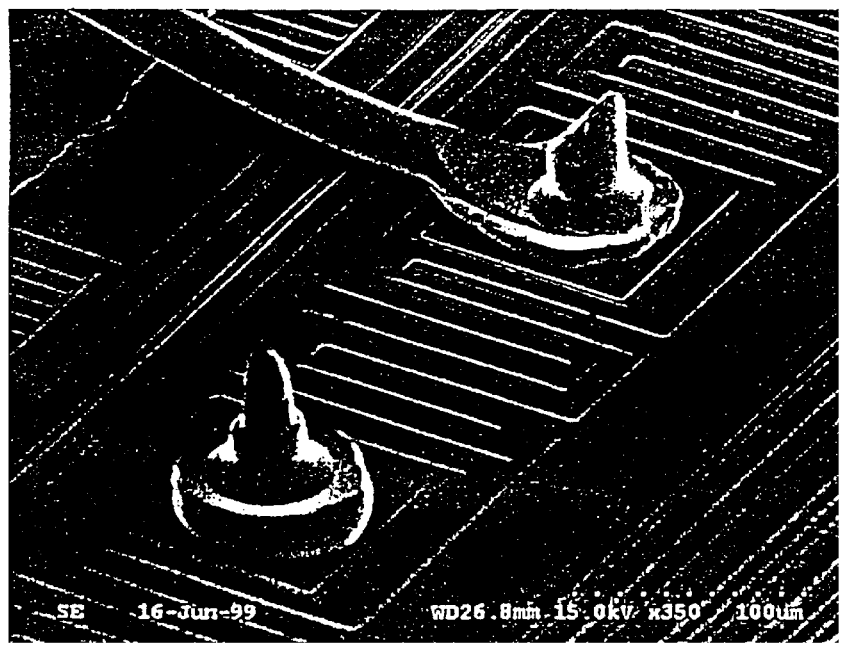
FIG. 15 is a perspective view of a wire bonding connection with 0.2 mil deviation of the second wire bonding in accordance with the present invention.
Figure 16:
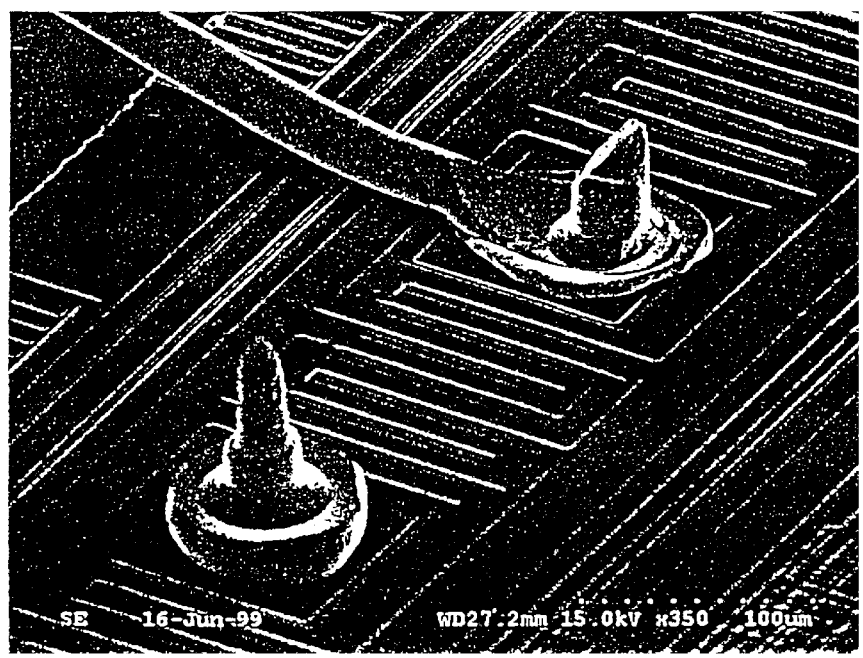
FIG. 16 is a perspective view of a wire bonding connection with 0.4 mil deviation of the second wire bonding in accordance with the present invention.
Figure 17:
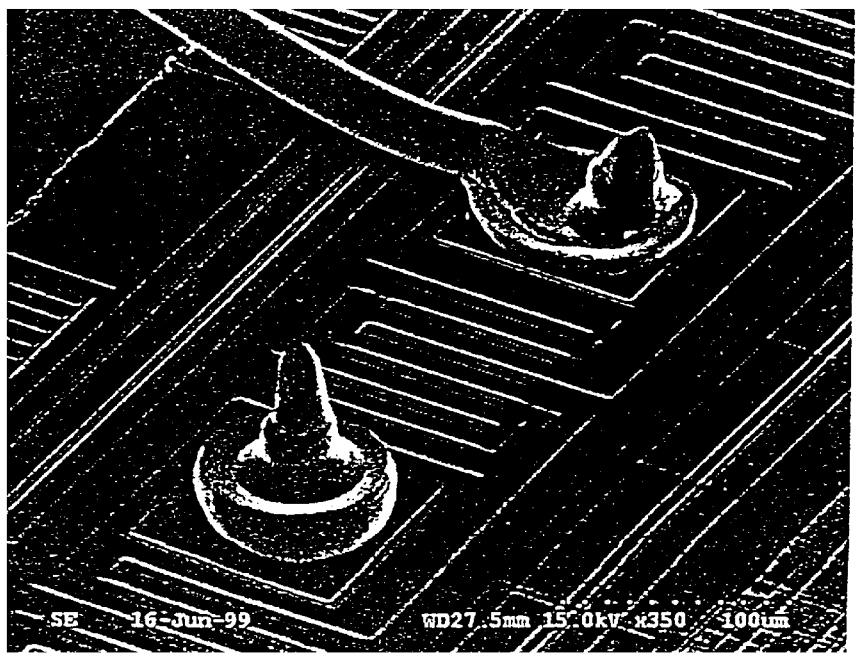
FIG. 17 is a perspective view of a wire bonding connection with 0.6 mil deviation of the second wire bonding in accordance with the present invention.
Figure 18:
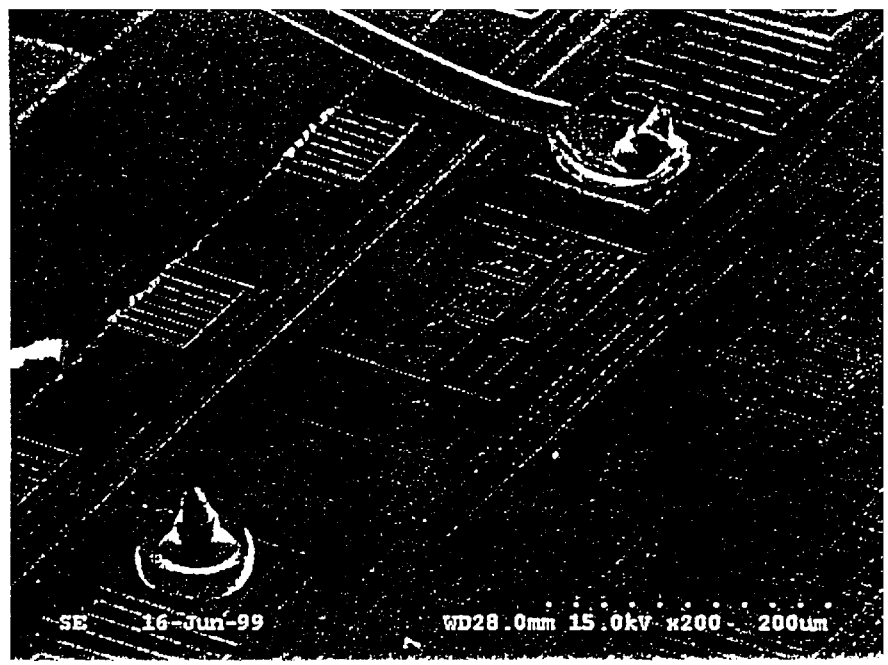
FIG. 18 is a perspective view of a wire bonding connection with 0.8 mil deviation of the second wire bonding in accordance with the present invention.
Figure 19:
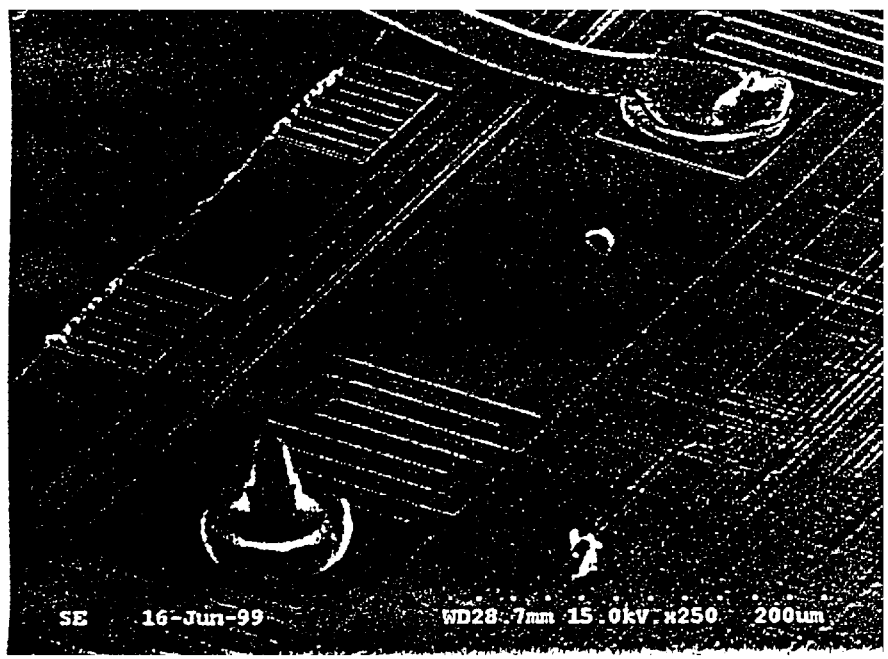
FIG. 19 is a perspective view of a wire bonding connection with 1.0 mil deviation of the second wire bonding in accordance with the present invention.

Referring to FIG. 12, the bumps of the second bonding point in the conventional methods are collapsed with various shapes, and the various shape of the bumps reduce the wire bonding area of the second bonding point in wire bonding process, and this decreases the reliability of product. On the contrary, the balls of the second bonding point in the present invention have uniform shapes and tips and provide a larger wire bonding area on the second bonding point in the wire bonding process, and this increases the reliability of product.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A wire bonding method for electrically connecting a first bonding point with a second bonding point on a semiconductor device comprising the steps of:

forming a ball on the second bonding point, said ball having a body portion and a sharpened tip extending in the direction away from the second bonding point;

connecting an electrically conductive bonding wire with the first bonding point; and moving the bonding wire to the second bonding point and bonding the bonding wire on the ball formed on the second bonding point.

2. The wire bonding method as claimed in claim 1, wherein the ball is formed by the following steps:

heating the bonding wire to form the ball on a capillary;

moving the capillary down to the second bonding point and bonding the ball on the second bonding point; and moving the capillary up in a vertical direction thereby cutting the bonding wire by a tension force to form the sharpened tip on the ball extending in the direction away from the second bonding point.

3. The wire bonding method as claimed in claim 1, wherein the first bonding point is located on a first chip and the second bonding point is located on a second chip.

4. The wire bonding method as claimed in claim 1, wherein the first bonding point is located on a substrate and the second bonding point is located on a chip.

5. The wire bonding method as claimed in claim 1, wherein the first bonding point is located on a leadframe and the second bonding point is located on a chip.

6. The wire bonding method as claimed in claim 2, wherein the first bonding point is located on a first chip and the second bonding point is located on a second chip.

7. The wire bonding method as claimed in claim 2, wherein the first bonding point is located on a substrate and the second bonding point is located on a chip.

8. The wire bon ding method as claimed in claim 2, wherein the first bonding point is located on a leadframe and the second bonding point is located on a chip.

\* \* \* \* \*